(12) United States Patent
Joish et al.

(10) Patent No.: US 10,483,945 B2
(45) Date of Patent: Nov. 19, 2019

(54) SWITCHED CAPACITOR BASED DIGITAL STEP ATTENUATOR

(71) Applicant: Texas Instruments Incorporated, Dallas, TX (US)

(72) Inventors: Rajendrakumar Joish, Bangalore (IN); Visvesvaraya Pentakota, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 68 days.

(21) Appl. No.: 15/852,237

(22) Filed: Dec. 22, 2017

(65) Prior Publication Data

US 2018/0183409 A1 Jun. 28, 2018

(30) Foreign Application Priority Data

Dec. 27, 2016 (IN) .............................. 201641044444

(51) Int. Cl.
| | | |
|---|---|---|
| *H03H 11/24* | (2006.01) | |
| *H03H 7/25* | (2006.01) | |
| *H01F 38/14* | (2006.01) | |
| *H03K 17/687* | (2006.01) | |
| *H03G 1/00* | (2006.01) | |
| *H04B 1/18* | (2006.01) | |
| *H03G 3/00* | (2006.01) | |
| *H03G 3/30* | (2006.01) | |

(52) U.S. Cl.
CPC ........... *H03H 11/245* (2013.01); *H01F 38/14* (2013.01); *H03G 1/0088* (2013.01); *H03G 3/001* (2013.01); *H03G 3/3052* (2013.01); *H03H 7/25* (2013.01); *H03K 17/687* (2013.01); *H04B 1/18* (2013.01); *H03G 2201/106* (2013.01)

(58) Field of Classification Search
CPC ........ H03H 11/245; H03H 11/24; H03H 7/24; H03H 7/25; H03G 1/0088; H03G 2201/106
USPC .................................. 333/81 R; 327/308, 309
See application file for complete search history.

(56) References Cited

U.S. PATENT DOCUMENTS

| | | | | |
|---|---|---|---|---|
| 3,652,959 A | * | 3/1972 | Denny | ................... H03H 7/255 333/81 R |
| 6,617,838 B1 | * | 9/2003 | Miranda | ............ G01R 19/0092 324/117 R |
| 2009/0066394 A1 | * | 3/2009 | Kanda | ................ H03H 11/1291 327/308 |
| 2012/0161843 A1 | * | 6/2012 | Yashima | .............. H03G 1/0058 327/308 |

* cited by examiner

*Primary Examiner* — Stephen E. Jones
(74) *Attorney, Agent, or Firm* — John R. Pessetto; Charles A. Brill; Frank D. Cimino (57) ABSTRACT

The disclosure provides an RF receiver. The RF receiver includes an input driver. The input driver receives a coarse signal, and generates an input signal. A digital step attenuator (DSA) is coupled to the input driver and receives the input signal. An analog to digital converter (ADC) is coupled to the DSA. The DSA includes a serial capacitor coupled to the input driver. The DSA also includes a sampling capacitor coupled to the ADC.

20 Claims, 3 Drawing Sheets

SWITCHED CAPACITOR BASED DIGITAL STEP ATTENUATOR

CROSS REFERENCES TO RELATED APPLICATIONS

This application claims priority from India provisional patent application No. 201641044444 filed on Dec. 27, 2016 which is hereby incorporated by reference in its entirety.

TECHNICAL FIELD

The present disclosure is generally related to an RF (radio frequency) receiver and more particularly to a digital step attenuator used in the RF receiver.

BACKGROUND

Recent advancements in wireless communications require an RF receiver that can support a wide dynamic range of analog input signals. A digital step attenuator (DSA) is widely used in the RF receivers with wideband and multi-band applications. The DSA is an analog attenuator whose attenuation is controlled digitally. The DSA can be integrated with the RF receiver or it can be external to the RF receiver. However, it is preferred to integrate the DSA in the RF receiver since it reduces the overall board area and also the cost.

Due to high dynamic range of analog input signals received by the RF receiver, the DSA is required to support a large range of attenuations. This ensures that a voltage level reaching the other components of the RF receiver post DSA is within a defined limit, so as to ensure normal operation of the RF receiver. Thus, DSA is important for ensuring reliability of the components used in the RF receiver. A DSA, that supports the high dynamic range of analog inputs signals, is difficult to integrate in the RF receiver. This is because of large noise figure that it adds to the RF receiver.

SUMMARY

According to an aspect of the disclosure, an RF receiver is disclosed. The RF receiver includes an input driver. The input driver receives a coarse signal, and generates an input signal. A digital step attenuator (DSA) is coupled to the input driver and receives the input signal. An analog to digital converter (ADC) is coupled to the DSA. The DSA includes a serial capacitor coupled to the input driver. The DSA also includes a sampling capacitor coupled to the ADC.

DETAILED DESCRIPTION OF THE EMBODIMENTS

Figure 1:
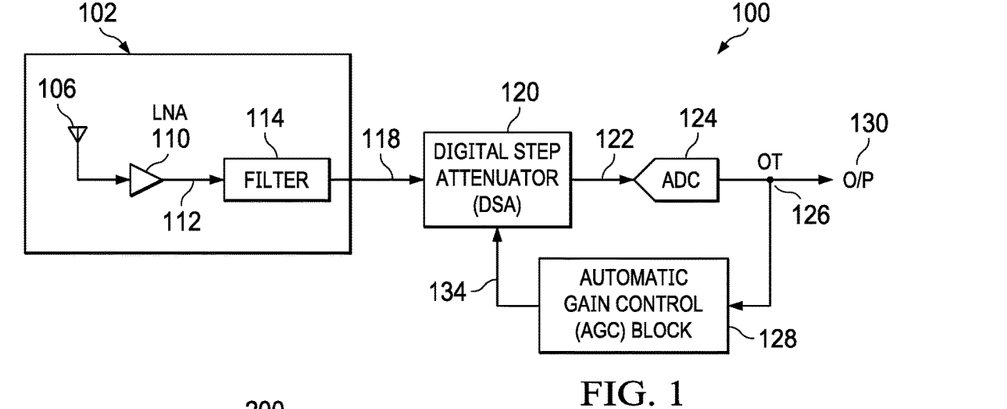
FIG. 1 is a block diagram illustrating an example radio frequency (RF) receiver in which several aspects of the present invention can be implemented.

FIG. 1 is a block diagram illustrating an example radio frequency (RF) receiver 100 in which several aspects of the present invention can be implemented. The RF receiver 100 includes an input driver 102, a digital step attenuator (DSA) 120, an analog to digital converter (ADC) 124 and an automatic gain control (AGC) block 128. The input driver 102 includes an antenna 106, a low noise amplifier (LNA) 110 and a filter 114. The LNA 110 is coupled to the antenna 106, and the filter 114 is coupled to the LNA 110.

The DSA 120 is coupled to the input driver 102, and the ADC 124 is coupled to the DSA 120. In one example, a gain stage block is coupled between the DSA 120 and the ADC 124. The AGC block 128 is coupled to the ADC 124 and the DSA 120. The RF receiver 100 may include one or more additional components known to those skilled in the relevant art and are not discussed here for simplicity of the description.

The antenna 106 in the input driver 102 receives a coarse signal. The LNA 110 amplifies the coarse signal to generate an amplified signal 112. The filter 114 receives the amplified signal 112, and filters the amplified signal 112 to generate an input signal 118. The DSA 120 is coupled to the filter 114, and receives the input signal 118. The DSA 120 attenuates the input signal 118 to generate an attenuated signal 122. The ADC 124 receives the attenuated signal 122, and generates an output signal O/P 130 at an output terminal OT 126.

The AGC block 128 is coupled to the output terminal OT 126, and receives the output signal O/P 130 as a feedback. The AGC block 128 generates a program signal 134 which is provided to the DSA 120. The program signal 134 includes an attenuation setting. The DSA 120 attenuates the input signal 118 based on the attenuation setting received from the AGC block 128. In one version, the DSA 120 receives the attenuation setting from a serial peripheral interface (SPI) or by any other means known in the art.

Figure 2:
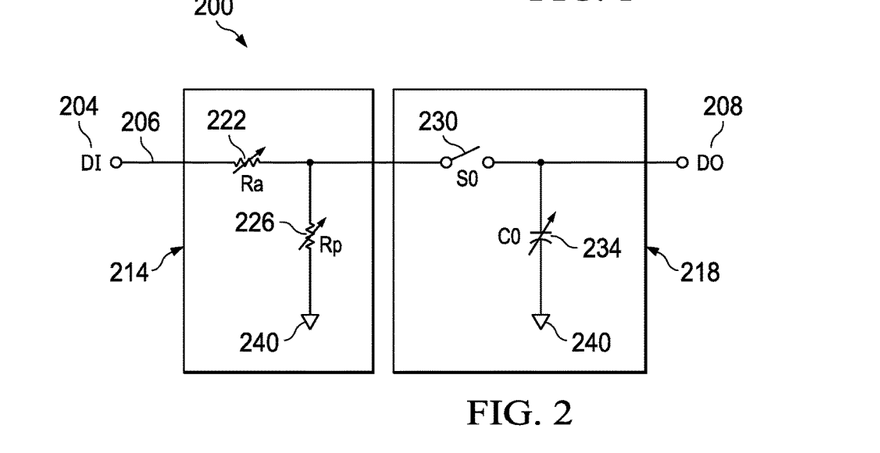
FIG. 2 illustrates a digital step attenuator (DSA)

FIG. 2 illustrates a digital step attenuator (DSA) 200. The DSA 200, in one example, is part of the radio frequency (RF) receiver 100, and is very similar in connection to the DSA 120. The DSA 200 includes a DSA input terminal DI 204 and a DSA output terminal DO 208. The DSA input terminal DI 204 is coupled to an input driver. The input driver is analogous, in connection and operation, to the input driver 102 illustrated in FIG. 1. The DSA output terminal DO 208 is coupled to an analog to digital converter (ADC). The ADC is analogous, in connection and operation, to the ADC 124 illustrated in FIG. 1.

The DSA 200 includes an attenuation stage 214 and a sample and hold stage 218. The attenuation stage 214 includes a primary resistor Ra 222 and a secondary resistor Rp 226. The primary resistor Ra 222 is coupled to the DSA input terminal DI 204. The secondary resistor Rp 226 is coupled between the primary resistor Ra 222 and a fixed voltage terminal 240. The sample and hold stage 218 is coupled between the attenuation stage 214 and the DSA output terminal DO 208.

The sample and hold stage 218 includes a sampling switch S0 230 and a sampling capacitor C0 234. The sampling switch S0 230 is coupled to the primary resistor Ra 222 and the secondary resistor Rp 226. The sampling capacitor C0 234 is coupled between the sampling switch S0 230 and the fixed voltage terminal 240. The sampling switch S0 230 and the sampling capacitor C0 234 are also coupled to the DSA output terminal DO 208.

The operation of the DSA 200 is explained in connection with the RF receiver 100, illustrated in FIG. 1. The DSA 200 receives an input signal 206 at the DSA input terminal DI 204. The input signal 206 is received from the input driver, for example the input driver 102 illustrated in FIG. 1.

The attenuation stage 214 is responsible for attenuating the input signal 206 by use of the primary resistor Ra 222 and the secondary resistor Rp 226 which acts as a resistor-divider network. The sample and hold stage 218 operates in a sample phase and a hold phase. In the sample phase, the sampling switch S0 230 is closed, and the sampling capacitor C0 234 is charged by the input signal 206. In the hold phase, the sampling switch S0 230 is opened, and a charge accumulated on the sampling capacitor C0 234 is provided to the ADC, for example the ADC 124 illustrated in FIG. 1.

The ADC 124 generates an output signal based on the charge accumulated on the sampling capacitor C0 234. The AGC block 128 generates a program signal based on the output signal generated by the ADC 124. The program signal includes an attenuation setting which is provided to the DSA 200. The attenuation setting is used to refine or fix values of the primary resistor Ra 222, the secondary resistor Rp 226 and the sampling capacitor C0 234.

The DSA 200 suffers from multiple disadvantages. A DSA in an RF receiver is required to support a large range of attenuations primarily because of a high dynamic range of the input signal 206. To meet such high attenuation range, the secondary resistor Rp 226 is required to be varied over a long range.

Noise figure is a ratio of a total noise spectral density and an effective input port noise spectral density at the DSA output terminal DO 208 at a given frequency of the input signal 206. The total noise spectral density is inversely proportional to a value of the sampling capacitor C0 234. Assuming a flat noise spectral density at a given frequency of the input signal 206, the total noise spectral density is defined as:

$$N_t = \frac{kT}{C0 \times \frac{Fs}{2}} \quad (1)$$

where k is Boltzmann constant, T is temperature in kelvin, and Fs is sampling frequency.

The effective input port noise spectral density is defined as:

$$N_{port} \approx \beta^2 \times 4 \, kT_{port} Rs \quad (2)$$

where, Rs is resistance offered by the input driver at the DSA input terminal DI 204, $\beta$ is attenuation of input port noise voltage from the DSA input terminal DI 204 to the DSA output terminal DO 208, and $T_{port}$ is temperature of the DSA input terminal DI 204 in kelvin. Noise figure and noise factor are defined as:

$$\text{Noise factor} = N_{fac} = \frac{N_t}{N_{port}} \alpha \frac{1}{C0 \times \beta^2 \times Rs} \quad (3)$$

$$\text{Noise figure} = NF = 10 \times \log_{10} N_{fac} \quad (4)$$

A bandwidth of the RF receiver (in radians per second) incorporating the DSA 200 is given as:

$$BW = \frac{1}{C0 \times R_{eff}} \quad (5)$$

where, $R_{eff}$ is an effective resistance of the attenuation stage 214 and is measured from the primary resistor Ra 222, the secondary resistor Rp 226 and resistance offered by the input driver Rs.

Thus, from above equations, in order to minimize noise figure, values of sampling capacitor C0 234 and the secondary resistor Rp 226 have to be increased. However, the bandwidth of the RF receiver is inversely proportional to the effective resistance Reff and the sampling capacitor C0 234, and if the value of the secondary resistor Rp 226 and the sampling capacitor C0 234 is increased, the bandwidth is reduced proportionately. Hence, a minimum noise figure is limited by the bandwidth of the RF receiver and resistance offered by input driver Rs. In one implementation, the minimum noise figure is approximately 11 dB.

To achieve maximum attenuation, a lower value of the secondary resistor Rp 226 is needed than that used for achieving the minimum noise figure. This requires big switches to be used in a resistor array that forms the secondary resistor Rp 226. These big switches results in higher parasitic capacitances. Also, a high current thorough the secondary resistor Rp 226 results in a higher non-linearity in these switches.

The attenuation setting received by the DSA 200 also impacts the noise figure. The total noise spectral density does not change with attenuations setting when a value of the sampling capacitor C0 234 is constant. However, the effective input port noise spectral density decreases proportional to the attenuation setting. This results in noise figure degrading by 1 dB for every 1 dB change in attenuation setting. Correspondingly, a 10 dB increase in the attenuation setting increases the noise figure by 10 dB.

Another disadvantage is that, if any bandwidth improvement is achieved by inductive peaking at the DSA output terminal DO 208, it is not controllable across attenuation settings due to a large variation in the secondary resistor Rp 226. Thus, the DSA 200 suffers from multiple disadvantages which makes it unfit for RF receivers with wideband and multiband applications.

Figure 3:
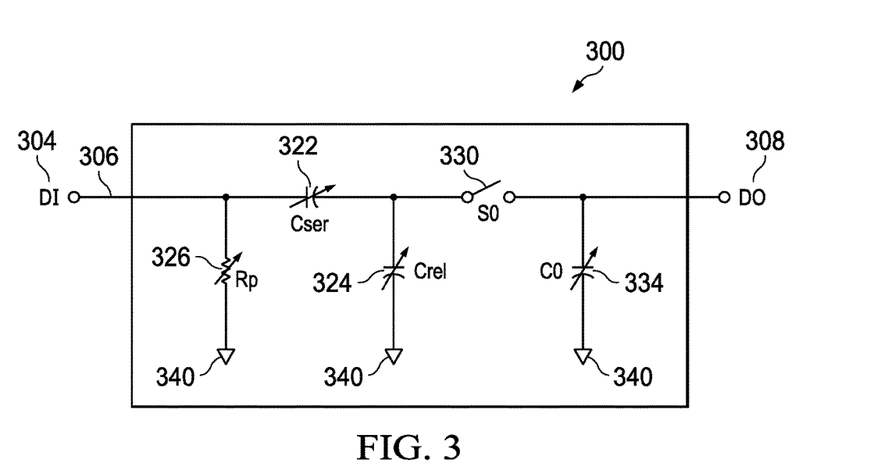
FIG. 3 illustrates a digital step attenuator (DSA), according to an embodiment.

FIG. 3 illustrates a digital step attenuator (DSA) 300, according to an embodiment. The DSA 300, in one example, is part of the radio frequency (RF) receiver 100, and is very similar in connection to the DSA 120. The DSA 300 includes a DSA input terminal DI 304 and a DSA output terminal DO 308. The DSA input terminal DI 304 is coupled to an input driver. The input driver is analogous, in connection and operation, to the input driver 102 illustrated in FIG. 1. The DSA input terminal DI 304 is coupled to a filter in the input driver, for example the filter 114 illustrated in FIG. 1. The DSA output terminal DO 308 is coupled to an analog to digital converter (ADC). The ADC is analogous, in connection and operation, to the ADC 124 illustrated in FIG. 1.

The DSA 300 includes a secondary resistor Rp 326, a serial capacitor Cser 322, a reliability capacitor Crel 324, a sampling switch S0 330 and a sampling capacitor C0 334. The serial capacitor Cser 322 is coupled to the input driver, for example the input driver 102, and the sampling capacitor C0 334 is coupled to the ADC, for example the ADC 124. The secondary resistor Rp 326 is coupled between the DSA input terminal DI 304 and a fixed voltage terminal 340. In one version, the fixed voltage terminal 340 is at ground voltage.

The sampling switch S0 330 is coupled to the serial capacitor Cser 322 and the DSA output terminal DO 308. The sampling capacitor C0 334 is coupled to the sampling switch S0 330, the DSA output terminal DO 308 and the fixed voltage terminal 340. The reliability capacitor Crel 324 is coupled to the serial capacitor Cser 322, the sampling switch S0 330 and the fixed voltage terminal 340. The presence of the serial capacitor Cser 322 and the sampling capacitor C0 334 makes the DSA 300, a switched capacitor based DSA. In one example, the DSA 300 includes a biasing circuit coupled to the DSA output terminal DO 308. The biasing circuit includes a secondary resistor coupled to the fixed voltage terminal 340 through a secondary switch. The secondary resistor is coupled between the secondary switch and the DSA output terminal DO 308. The biasing circuit is used to DC bias the DSA output terminal DO 308. The secondary switch and the sampling switch S0 330 are clocked by a sampling clock. The DSA 300 may include one or more additional components known to those skilled in the relevant art and are not discussed here for simplicity of the description.

The operation of the DSA 300 is explained in connection with the RF receiver 100, illustrated in FIG. 1. The DSA 300 receives an input signal 306 at the DSA input terminal DI 304. The input signal 306 is received from the input driver, for example the input driver 102 illustrated in FIG. 1. The DSA 300 is responsible for attenuating the input signal 306. The DSA 300 operates in a sample phase and a hold phase.

In the sample phase, the sampling switch S0 330 is closed. In one version, when the reliability capacitor Crel 324 is not present, the serial capacitor C0 334 and the sampling capacitor C0 334 are in series and are charged by the input signal 306. In another version, when the reliability capacitor Crel 324 is present, the serial capacitor C0 334, the reliability capacitor Crel 324 and the sampling capacitor C0 334 are charged by the input signal 306.

During the hold phase, the sampling switch S0 330 is opened. A charge accumulated on the sampling capacitor C0 334 is provided to the ADC, for example the ADC 124 illustrated in FIG. 1. The ADC 124 generates an output signal based on the charge accumulated on the sampling capacitor C0 334.

The output signal generated by the ADC 124 is provided to the AGC block 128 as a feedback. The AGC block 128 generates a program signal based on the output signal generated by the ADC 124. The program signal is provided to the DSA 300. The program signal includes an attenuation setting which is provided to the DSA 300. The attenuation setting is used to refine or fix values of the secondary resistor Rp 326, the serial capacitor Cser 322, the reliability capacitor Crel 324, and the sampling capacitor C0 334.

During hold phase, the connection between the serial capacitor Cser 322 and the sampling switch S0 330 can swing very high due to no load. This can damage switches used in the DSA 300 or make them leak. This can cause reliability problems in case low voltage transistors are used. The problem is countered by use of the reliability capacitor Crel 324. The reliability capacitor Crel 324 provides enough load so that the voltage swings are within desirable limits during the hold phase. For low attenuation, the reliability capacitor Crel 324 is not required, as the voltage swings would be small and would not damage switches used in the DSA 300.

Thus, in the DSA 300, when the reliability capacitor Crel 324 is not present, both the serial capacitor Cser 322 and the sampling capacitor C0 334 provides attenuation to the input signal 306. Also, when the reliability capacitor Crel 324 is present, the serial capacitor C0 334, the reliability capacitor Crel 324 and the sampling capacitor C0 334 provides attenuation to the input signal 306.

A DSA in an RF receiver is required to support a large range of attenuations primarily because of a high dynamic range of the input signal 306. The DSA 300 is able to meet such large range of attenuations. This is illustrated now and the calculations are performed assuming the reliability capacitor Crel 324 is not present. Assuming a flat noise spectral density, a total noise spectral density at a given frequency of the input signal 306, is defined as:

$$N_t = \frac{kT \times C_{eff}}{C_0^2 \times \frac{Fs}{2}} \quad (6)$$

where, k is Boltzmann constant, T is temperature in kelvin, and Fs is sampling frequency, and $C_{eff}$ is effective capacitance and is measured from a series sum of the serial capacitor Cser 322 and the sampling capacitor C0 334.

An effective input port noise spectral density is defined as:

$$N_{port} \approx \beta^2 \times 4\, kT_{port} Rs \quad (7)$$

where, Rs is resistance offered by the input driver at the DSA input terminal DI 304, β is attenuation of input port noise voltage from the DSA input terminal DI 304 to the DSA output terminal DO 308, and $T_{port}$ is temperature of the DSA input terminal DI 304 in kelvin. β is defined by following equation:

$$\beta = \left(\frac{R_{eff}}{Rs}\right) \times \left(\frac{C_{eff}}{C0}\right) \quad (8)$$

where, $R_{eff}$ is effective resistance and is measured from a parallel sum of Rs and Rp.

Noise figure and noise factor are defined as:

$$\text{Noise factor} = N_{fac} = \frac{N_t}{N_{port}} \alpha \frac{1}{C_0^2 \times \beta^2 \times Rs} \quad (9)$$

$$\text{Noise figure} = NF = 10 \times \log_{10} N_{fac} \quad (10)$$

A bandwidth of the RF receiver (in radians per second) incorporating the DSA 300 is given as:

$$BW = \frac{1}{C_{eff} \times R_{eff}} \quad (11)$$

Thus, for a given bandwidth and Rs, the noise figure at minimum attenuation in the DSA 300 is less than DSA 200. This is because in the DSA 300, the attenuation is significantly provided by the sampling capacitor C0 334 and the serial capacitor Cser 322. For the same values of Rs and bandwidth, the DSA 300 provides lower noise figure as compared to the DSA 200. In one version, the noise figure for DSA 300 is approximately 8 dB. The major advantage of the DSA 300 is that the capacitors determining the total noise spectral density and the capacitors determining the bandwidth are significantly decoupled. This ensures that the noise figure is reduced independently without compromising the bandwidth.

At higher attenuations, in one version, a value of the sampling capacitor C0 334 is fixed and a value of the serial capacitor Cser 322 is varied across attenuation settings. Although, the effective input port noise spectral density decreases proportional to an increase in the attenuation setting because of reduction in effective capacitance $C_{eff}$, the total noise spectral density also reduces unlike DSA 200. Hence, the noise figure increases less than 1 dB for every 1 dB change in the attenuation setting. It is noted that a 10 dB change in attenuation increases the noise figure by around 7 dB.

At higher attenuations, in another version, a value of the serial capacitor Cser 322 fixed and a value of the sampling capacitor C0 334 is varied across attenuation settings. The effective input port noise spectral density decreases proportional to an increase in the attenuation setting. However, the total noise spectral density reduces because an increase in $C_0^2$ is much higher than the increase in effective capacitance $C_{eff}$. It is noted that a 10 dB change in attenuation increases the noise figure by around 2.8 dB. This is much better than the noise figure achieved in DSA 200. Across attenuation settings, a variation in the bandwidth of the DSA 300 is reduced by varying a value of the secondary resistor Rp 326 optimally. This also reflects that the capacitors determining the total noise spectral density and the capacitors determining the bandwidth are significantly decoupled.

One another advantage of DSA 300 is that a very less variation is needed in the secondary resistor Rp 326 to meet the bandwidth requirement across attenuation settings as compared to the DSA 200. Hence, if any bandwidth improvement is achieved by inductive peaking at the DSA output terminal DO 308, it is controllable across variations in attenuation. The variation in the secondary resistor Rp 326 is less compared to the variation in the secondary resistor Rp 226. Hence, if inductive peaking is used, it is more controllable in the DSA 300 across attenuation settings because of reduction in variation of quality factor and a peaking frequency. Thus, DSA 300 provides multiple advantages which make it ideal for RF receivers with wideband and multiband applications.

Figure 4:
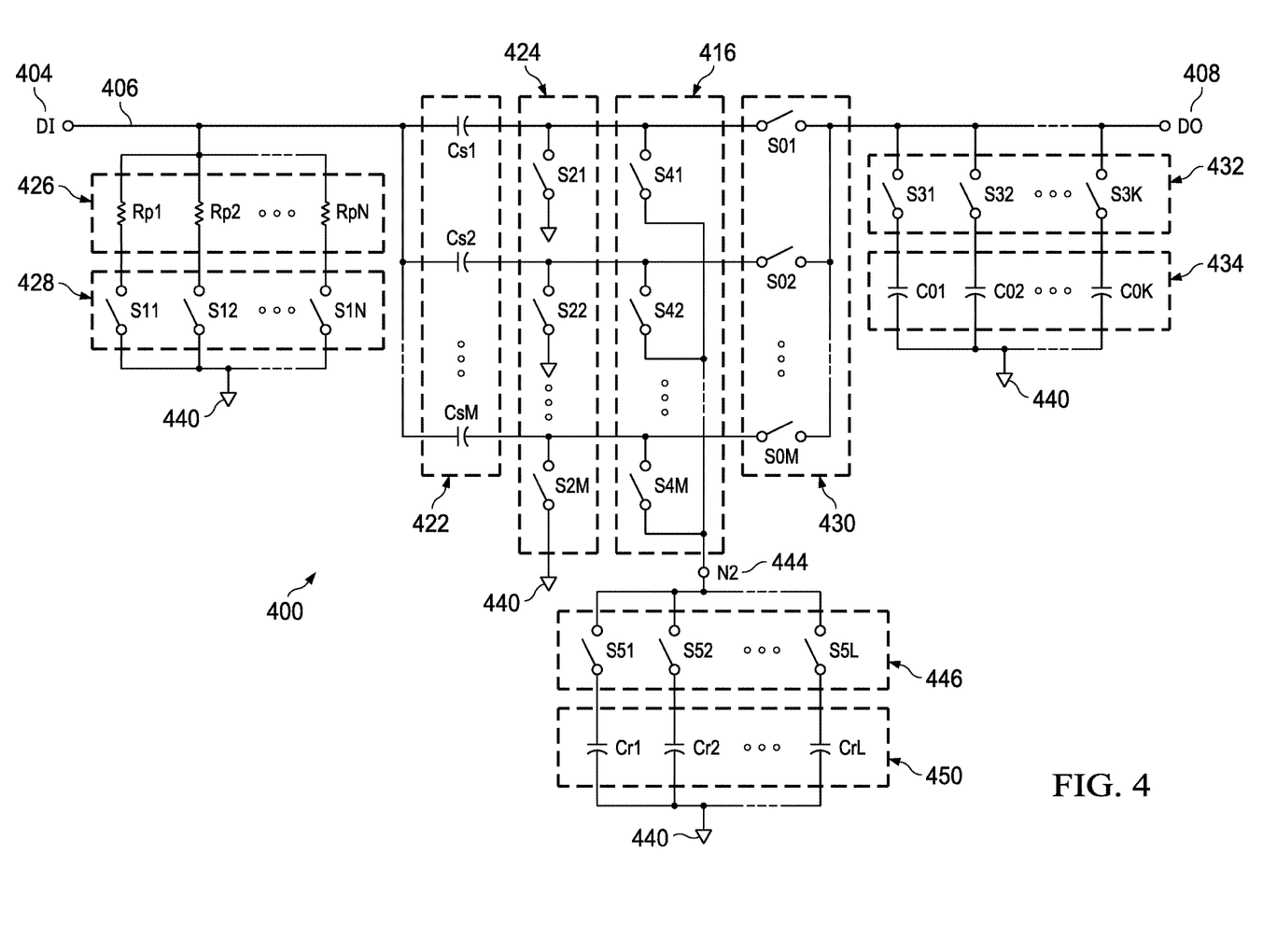
FIG. 4 illustrates a digital step attenuator (DSA), according to an embodiment.

FIG. 4 illustrates a digital step attenuator (DSA) 400, according to an embodiment. The DSA 400, in one example, is part of the radio frequency (RF) receiver 100, and is very similar in connection to the DSA 120. The DSA 400 includes a DSA input terminal DI 404 and a DSA output terminal DO 408. The DSA input terminal DI 404 is coupled to an input driver. The input driver is analogous, in connection and operation, to the input driver 102 illustrated in FIG. 1. The DSA input terminal DI 404 is coupled to a filter in the input driver, for example the filter 114 illustrated in FIG. 1. The DSA output terminal DO 408 is coupled to an analog to digital converter (ADC). The ADC is analogous, in connection and operation, to the ADC 124 illustrated in FIG. 1.

The DSA 400 includes an array of secondary resistors 426, an array of serial capacitors 422, an array of reliability capacitors 450, an array of sampling switches 430 and an array of sampling capacitors 434. The array of secondary resistors 426 is illustrated as Rp1, Rp2 to RpN. The array of secondary resistors 426 is coupled to the DSA input terminal DI 404. A set of first switches 428 illustrated as S11, S12 to S1N are coupled between the array of secondary resistors 426 and a fixed voltage terminal 440. In one version, the fixed voltage terminal 440 is at ground voltage.

Each first switch of the set of first switches 428 is coupled between a secondary resistor of the array of secondary resistors 426 and the fixed voltage terminal 440. For example, a first switch S11 is coupled between the secondary resistor Rp1 and the fixed voltage terminal 440. The array of serial capacitors 422, illustrated as Cs1, Cs2 to CsM, is coupled between the DSA input terminal DI 404 and a set of second switches 424. The set of second switches 424 are illustrated as S21, S22 to S2M. Each second switch of the set of second switches 424 is coupled between a serial capacitor of the array of serial capacitors 422 and the fixed voltage terminal 440. For example, a second switch S21 is coupled between the serial capacitor Cs1 and the fixed voltage terminal 440.

The array of sampling switches 430, represented as S01, S02 to S0M, is coupled between the array of serial capacitors 422 and the DSA output terminal DO 408. Each sampling switch of the array of sampling switches 430 is coupled to a serial capacitor of the array of serial capacitors 422, a second switch of the set of the second switches 424 and the DSA output terminal DO 408. For example, a sampling switch S01 is coupled to the serial capacitor Cs1, the second switch S21 and the DSA output terminal DO 408. The DSA 400 also includes a set of third switches 432, illustrated as S31, S32 to S3K, coupled to the DSA output terminal DO 408.

The array of sampling capacitors 434, illustrated as C01, C02 to C0K, is coupled to the set of third switches 432. Each sampling capacitor of the array of sampling capacitors 434 is coupled between a third switch of the set of third switches 432 and the fixed voltage terminal 440. For example, the sampling capacitor C01 is coupled between the third switch S31 and the fixed voltage terminal 440.

The DSA 400 further includes a set of fourth switches 416 illustrated as S41, S42 to S4M and a set of fifth switches 446 illustrated as S51, S52 to S5L. The set of fourth switches 416 is coupled between the array of serial capacitors 422 and a second node N2 444. Each fourth switch of the set of fourth switches 416 is coupled between a serial capacitor of the array of serial capacitors 422 and the second node N2 444. For example, a fourth switch S41 is coupled between the serial capacitor Cs1 and the second node N2 444.

The set of fifth switches 446 are coupled between the second node N2 444 and an array or reliability capacitors 450. The array of reliability capacitors 450 is illustrated as Cr1, Cr2 to CrL. Each fifth switch of the set of fifth switches 446 is coupled between the second node N2 444 and a reliability capacitor of the array of reliability capacitors 450. For example, a fifth switch S51 is coupled between the second node N2 444 and a reliability capacitor Cr1. One end of each reliability capacitor is coupled to the fixed voltage terminal 440.

The array of serial capacitors 422 is coupled to the input driver, for example the input driver 102, and the array of sampling capacitors 434 is coupled to the ADC, for example the ADC 124. In one example, the DSA 400 includes a biasing circuit coupled to the DSA output terminal DO 408. The biasing circuit includes a secondary resistor coupled to the fixed voltage terminal 440 through a secondary switch. The secondary resistor is coupled between the secondary switch and the DSA output terminal DO 408. The biasing circuit is used to DC bias the DSA output terminal DO 408. The secondary switch and array of sampling switches 430 are clocked by a sampling clock. The DSA 400 may include one or more additional components known to those skilled in the relevant art and are not discussed here for simplicity of the description.

The operation of the DSA 400 is explained in connection with the RF receiver 100, illustrated in FIG. 1. The DSA 400 receives an input signal 406 at the DSA input terminal DI 404. The input signal 406 is received from the input driver, for example the input driver 102 illustrated in FIG. 1. The DSA 400 is responsible for attenuating the input signal 406.

Any sampling switch of the array of sampling switches 430 when closed connects the corresponding serial capacitor to the DSA output terminal DO 408. The array of sampling switches 430 are controlled by the sampling clock. All the other switches in the DSA 400 are controlled by select signals.

A second switch of the set of second switches 424 when closed disconnects the corresponding serial capacitor from the DSA output terminal DO 408. For example, if the second switch S21 is closed, the corresponding serial capacitor Cs1 is coupled to the fixed voltage terminal 440 and hence disconnected from the DSA output terminal DO 408. When the second switch S21 is closed, the first switch S01 will not be clocked and both the first switch S01 and the fourth switch S41 will be opened. A fourth switch is closed only when a corresponding serial capacitor has been selected to connect to the DSA output terminal DO 408. For example, the fourth switch S41 is closed only when the corresponding serial capacitor Cs1 has been selected to connect to the DSA output terminal DO 408.

The set of fifth switches 446 are closed depending on the requirement of a reliability capacitance to be added to the DSA 400 and an attenuation setting received from an AGC block coupled to the ADC. The set of first switches 428 are closed based on the attenuation setting and determines a total resistor value. The set of third switches 432 are closed based on the attenuation setting and determines a total sampling capacitance.

The DSA 400 operates in a sample phase and a hold phase in a manner similar to the operation of the DSA 300. In the hold phase, a charge accumulated on the array of sampling capacitors 434 is provided to the ADC, for example the ADC 124 illustrated in FIG. 1. The ADC 124 generates an output signal which is provided to the AGC block 128 as a feedback. The AGC block 128 generates a program signal based on the output signal generated by the ADC 124. The program signal is provided to the DSA 400. The program signal includes an attenuation setting which is provided to the DSA 400. The attenuation setting is used to refine or fix values of the array of secondary resistors 426, the array of serial capacitors 422, the array of reliability capacitors 450, and the array of sampling capacitors 434.

A DSA in an RF receiver is required to support a large range of attenuations primarily because of a high dynamic range of the input signal 406. The DSA 400 is able to meet such large range of attenuations. The advantages of the DSA 400 are similar to the DSA 300 and are not iterated here for sake of brevity of description.

Figure 5:
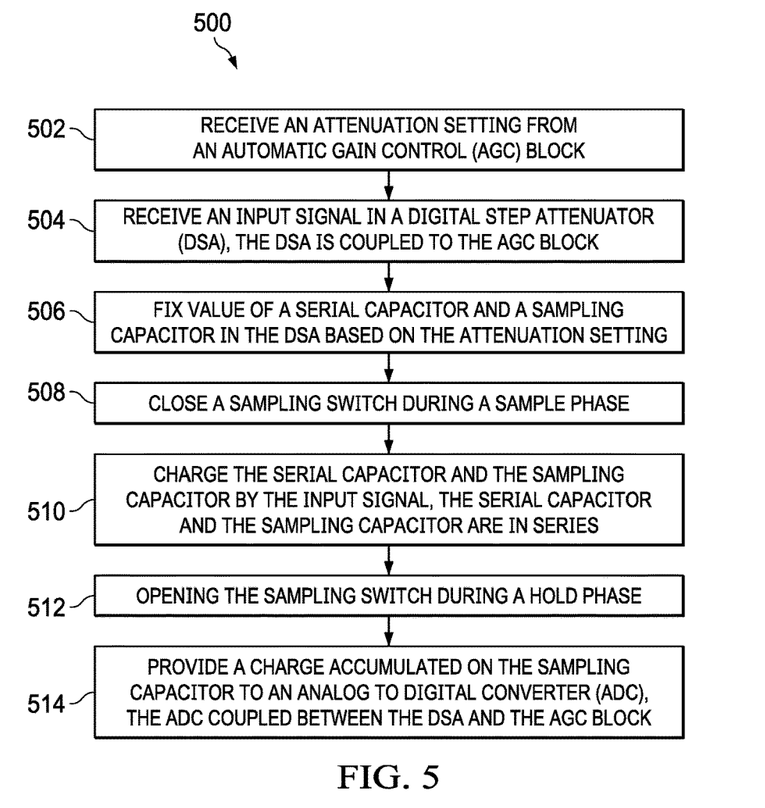
FIG. 5 is a flowchart to illustrate a method of operation of a digital step attenuator, according to an embodiment.

FIG. 5 is a flowchart 500 to illustrate a method of operation of a digital step attenuator, according to an embodiment. The flowchart is explained in connection with the digital step attenuator (DSA) 300 illustrated in FIG. 3. At step 502, an attenuation setting is received from an automatic gain control (AGC) block. In the DSA 300, for example, the AGC block 128 generates a program signal based on the output signal generated by the ADC 124. The program signal is provided to the DSA 300. The program signal includes an attenuation setting which is provided to the DSA 300.

At step 504, an input signal is received in a digital step attenuator (DSA). The DSA is coupled to the AGC block. The DSA 300, illustrated in FIG. 3, receives an input signal 306 at the DSA input terminal DI 304. The input signal 306 is received from the input driver, for example the input driver 102 illustrated in FIG. 1. The DSA 300 is responsible for attenuating the input signal 306. At step 506, value of a serial capacitor and a sampling capacitor are fixed in the DSA based on the attenuation setting. In DSA 300, the attenuation setting is used to refine or fix values of the secondary resistor Rp 326, the serial capacitor Cser 322 and the sampling capacitor C0 334.

At step 508, a sampling switch is closed during a sample phase. The serial capacitor and the sampling capacitor are charged by the input signal, at step 510. The serial capacitor and the sampling capacitor are in series. The DSA 300 operates in a sample phase and a hold phase. In the sample phase, the sampling switch S0 330 is closed. In one version, when the reliability capacitor Crel 324 is not present, the serial capacitor C0 334 and the sampling capacitor C0 334 are in series and are charged by the input signal 306. In another version, when the reliability capacitor Crel 324 is present, the serial capacitor C0 334, the reliability capacitor Crel 324 and the sampling capacitor C0 334 are charged by the input signal 306.

At step 512, the sampling switch is opened during a hold phase. At step 514, a charge accumulated on the sampling capacitor is provided to an analog to digital converter (ADC), the ADC coupled between the DSA and the AGC block. In DSA 300, during the hold phase, the sampling switch S0 330 is opened. A charge accumulated on the sampling capacitor C0 334 is provided to the ADC, for example the ADC 124 illustrated in FIG. 1. The ADC 124 generates an output signal based on the charge accumulated on the sampling capacitor C0 334. The output signal generated by the ADC 124 is provided to the AGC block 128 as a feedback.

The digital step attenuator using the method illustrated in the flowchart 500 can support large range of attenuations. The serial capacitor and the sampling capacitor are in series which results in a lower noise figure. Noise figure is a ratio of a total noise spectral density and an effective input port noise spectral density at the DSA output terminal at a given frequency of the input signal. For a given bandwidth, the noise figure is determined by an effective capacitance $C_{eff}$ and the sampling capacitor C0. The effective capacitance $C_{eff}$ is measured from a series sum of the serial capacitor and the sampling capacitor.

The major advantage of the DSA using the method illustrated in the flowchart 500 is that the capacitors determining the total noise spectral density and the capacitors determining a bandwidth of the RF receiver are significantly decoupled. This ensures that the noise figure is reduced independently without compromising the bandwidth.

One another advantage is that a very less variation is needed in the secondary resistor to meet the bandwidth requirement across attenuation settings. Hence, if any bandwidth improvement is achieved by inductive peaking at the DSA output terminal, it is controllable across variations in attenuation. Hence, if inductive peaking is used, it is more controllable across attenuation settings because of reduction in variation of quality factor and a peaking frequency. Thus, the method provides multiple advantages which make the DSA ideal for RF receivers with wideband and multiband applications.

Figure 6:
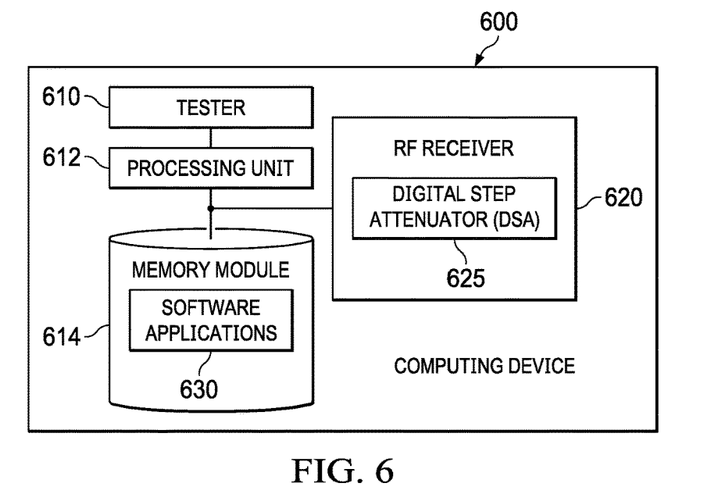
FIG. 6 illustrates a computing device, according to an embodiment.

FIG. 6 illustrates a computing device 600, according to an embodiment. The computing device 600 is, or is incorporated into, a mobile communication device, such as a mobile phone, a personal digital assistant, a transceiver, a personal computer, or any other type of electronic system. The computing device 600 may include one or more additional components known to those skilled in the relevant art and are not discussed here for simplicity of the description.

In some embodiments, the computing device 600 comprises a megacell or a system-on-chip (SoC) which includes a processing unit 612 such as a CPU (Central Processing Unit), a memory module 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP).

The memory module 614 (which can be memory such as RAM, flash memory, or disk storage) stores one or more software applications 630 (e.g., embedded applications) that, when executed by the processing unit 612, performs any suitable function associated with the computing device 600. The tester 610 comprises logic that supports testing and debugging of the computing device 600 executing the software applications 630.

For example, the tester 610 can be used to emulate a defective or unavailable component(s) of the computing device 600 to allow verification of how the component(s), were it actually present on the computing device 600, would perform in various situations (e.g., how the component(s) would interact with the software applications 630). In this way, the software applications 630 can be debugged in an environment which resembles post-production operation.

The processing unit 612 typically comprises memory and logic which store information frequently accessed from the memory module 614. The computing device 600 includes an RF receiver 620. The RF receiver 620 is coupled to the processing unit 612 and the memory module 614. The RF receiver 620 includes a digital step attenuator (DSA) 625. The DSA 625 is similar in connection and operation to the DSA 300 illustrated in FIG. 3. The DSA 625 includes a DSA input terminal DI and a DSA output terminal DO. The DSA input terminal DI is coupled to an input driver. The input driver is analogous, in connection and operation, to the input driver 102 illustrated in FIG. 1. The DSA input terminal DI is coupled to a filter in the input driver, for example the filter 114 illustrated in FIG. 1. The DSA output terminal DO is coupled to an analog to digital converter (ADC). The ADC is analogous, in connection and operation, to the ADC 124 illustrated in FIG. 1.

The DSA 625 includes a secondary resistor, a serial capacitor, a reliability capacitor, a sampling switch and a sampling capacitor. The serial capacitor is coupled to the input driver, for example the input driver 102, and the sampling capacitor is coupled to the ADC, for example the ADC 124. The secondary resistor is coupled between the DSA input terminal DI and a fixed voltage terminal.

The sampling switch is coupled to the serial capacitor and the DSA output terminal DO. The sampling capacitor is coupled to the sampling switch, the DSA output terminal and the fixed voltage terminal. The reliability capacitor is coupled to the serial capacitor, the sampling switch and the fixed voltage terminal.

The digital step attenuator 625 can support large range of attenuations. The serial capacitor and the sampling capacitor are in series which results in a lower noise figure. Noise figure is a ratio of a total noise spectral density and an effective input port noise spectral density at the DSA output terminal at a given frequency of the input signal. For a given bandwidth, the noise figure is determined by an effective capacitance $C_{eff}$ and the sampling capacitor C0. The effective capacitance is measured from a series sum of the serial capacitor and the sampling capacitor.

The major advantage of the DSA 625 is that the capacitors determining the total noise spectral density and the capacitors determining a bandwidth of the RF receiver 620 are significantly decoupled. This ensures that the noise figure is reduced independently without compromising the bandwidth.

One another advantage is that a very less variation is needed in the secondary resistor to meet the bandwidth requirement across attenuation settings. Hence, if any bandwidth improvement is achieved by inductive peaking at the DSA output terminal, it is controllable across variations in attenuation. Hence, if inductive peaking is used, it is more controllable across attenuation settings because of reduction in variation of quality factor and a peaking frequency. Thus, the DSA 625 provides multiple advantages which make it ideal for RF receivers with wideband and multiband applications.

Modifications are possible in the described embodiments, and other embodiments are possible, within the scope of the claims.

What is claimed is:

1. An RF receiver comprising:
   an input driver configured to receive a coarse signal, and configured to generate an input signal;
   a digital step attenuator (DSA) coupled to the input driver and configured to receive the input signal; and
   an analog to digital converter (ADC) coupled to the DSA, wherein the DSA further comprises:
   a serial capacitor coupled to the input driver; and
   a sampling capacitor coupled to the ADC.

2. The RF receiver of claim 1, wherein the serial capacitor and the sampling capacitor are configured to attenuate the input signal.

3. The RF receiver of claim 1, wherein the input driver further comprises:
   an antenna configured to receive the coarse signal;
   a low noise amplifier (LNA) coupled to the antenna and configured to amplify the coarse signal to generate an amplified signal; and
   a filter coupled to the LNA and configured to filter the amplified signal to generate the input signal.

4. The RF receiver of claim 3, wherein the DSA further comprises:
   a secondary resistor coupled between a DSA input terminal and a fixed voltage terminal, the DSA input terminal is coupled to the filter in the input driver; and
   a sampling switch coupled between the serial capacitor and a DSA output terminal, wherein the sampling capacitor is coupled to the sampling switch, the DSA output terminal and the fixed voltage terminal, and the serial capacitor is coupled between the DSA input terminal and the sampling switch.

5. The RF receiver of claim 4, wherein the DSA further comprises a reliability capacitor coupled to the serial capacitor, the sampling switch and the fixed voltage terminal.

6. The RF receiver of claim 4, wherein the ADC is coupled to the DSA output terminal, and the ADC is configured to generate an output signal at an output terminal.

7. The RF receiver of claim 6 further comprising an AGC (automatic gain control) block coupled to the output terminal and the DSA, the AGC block configured to receive the output signal as a feedback and configured to generate a program signal, the program signal is provided to the DSA.

8. An RF receiver comprising a digital step attenuator (DSA), the DSA comprising:
   an array of secondary resistors coupled to a DSA input terminal;
   a set of first switches coupled between the array of secondary resistors and a fixed voltage terminal, each first switch of the set of first switches is coupled between a secondary resistor of the array of secondary resistors and the fixed voltage terminal; and an array of serial capacitors coupled between the DSA input terminal and a set of second switches, wherein each second switch of the set of second switches is coupled between a serial capacitor of the array of serial capacitors and the fixed voltage terminal.

9. The RF receiver of claim 8, wherein the DSA further comprises:

an array of sampling switches coupled between the array of serial capacitors and a DSA output terminal, each sampling switch of the array of sampling switches is coupled to a serial capacitor of the array of serial capacitors, a second switch of the set of second switches and the DSA output terminal;

a set of third switches coupled to the DSA output terminal; and an array of sampling capacitors coupled to the set of third switches, each sampling capacitor of the array of sampling capacitors is coupled between a third switch of the set of third switches and the fixed voltage terminal.

10. The RF receiver of claim 8 further comprising an input driver coupled to the DSA input terminal, the input driver further comprising:

an antenna configured to receive a coarse signal;

a low noise amplifier (LNA) coupled to the antenna and configured to amplify the coarse signal to generate an amplified signal; and a filter coupled between the LNA and the DSA input terminal and configured to filter the amplified signal to generate an input signal.

11. The RF receiver of claim 8, wherein the DSA further comprises:

a set of fourth switches coupled between the array of serial capacitors and a second node, each fourth switch of the set of fourth switches is coupled between a serial capacitor of the array of serial capacitors and the second node; and a set of fifth switches coupled between the second node and an array of reliability capacitors, each fifth switch of the set of fifth switches is coupled between the second node and a reliability capacitor of the array of reliability capacitors, wherein one end of each reliability capacitor is coupled to the fixed voltage terminal.

12. The RF receiver of claim 8 further comprising:

an analog to digital converter (ADC) coupled to the DSA output terminal and configured to generate an output signal at an output terminal; and an AGC (automatic gain control) block coupled between the output terminal and the DSA, the AGC block is configured to receive the output signal as a feedback and configured to generate a program signal, the program signal is provided to the DSA.

13. A computing device comprising:
a processing unit;
a memory module coupled to the processing unit; and
an RF receiver coupled to the processing unit and the memory module, the RF receiver further comprising:
an input driver configured to receive a coarse signal, and configured to generate an input signal;
a digital step attenuator (DSA) coupled to the input driver and configured to receive the input signal; and
an analog to digital converter (ADC) coupled to the DSA, wherein the DSA further comprises:
a serial capacitor coupled to the input driver; and
a sampling capacitor coupled to the ADC.

14. The computing device of claim 13, wherein the DSA further comprises:

a secondary resistor coupled between a DSA input terminal and a fixed voltage terminal, the DSA input terminal is coupled to the filter in the input driver; and a sampling switch coupled to the serial capacitor and a DSA output terminal, wherein the sampling capacitor is coupled to the sampling switch, the DSA output terminal and the fixed voltage terminal and the serial capacitor is coupled between the DSA input terminal and the sampling switch.

15. The computing device of claim 14, wherein the DSA further comprises a reliability capacitor coupled to the serial capacitor, the sampling switch and the fixed voltage terminal.

16. A method comprising:
receiving an attenuation setting from an automatic gain control (AGC) block;
receiving an input signal in a digital step attenuator (DSA), the DSA is coupled to the AGC block;
fixing value of a serial capacitor and a sampling capacitor in the DSA based on the attenuation setting;
closing a sampling switch during a sample phase;
charging the serial capacitor and the sampling capacitor by the input signal, wherein the serial capacitor and the sampling capacitor are in series;
opening the sampling switch during a hold phase; and
providing a charge accumulated on the sampling capacitor to an analog to digital converter (ADC), the ADC coupled between the DSA and the AGC block.

17. The method of claim 16 further comprising fixing value of a secondary resistor in the DSA based on the attenuation setting.

18. The method of claim 16 further comprising fixing value of a reliability capacitor in the DSA based on the attenuation setting.

19. The method of claim 16 further comprising attenuating the input signal by the serial capacitor and the sampling capacitor.

20. The method of claim 16 further comprising :
generating an output signal by the ADC based on the charge accumulated on the sampling capacitor; and
generating a program signal based on the output signal, the program signal includes the attenuation setting.

* * * * *